(12) United States Patent
Huang et al.

(10) Patent No.: US 11,622,193 B2
(45) Date of Patent: Apr. 4, 2023

(54) LIMITER SYSTEM AND METHOD FOR AVOIDING CLIPPING DISTORTION OR INCREASING MAXIMUM SOUND LEVEL OF ACTIVE SPEAKER

(71) Applicant: Harman International Industries, Incorporated, Stamford, CT (US)

(72) Inventors: Mengrui Huang, Shenzhen (CN); Hongfei Zhou, Shenzhen (CN)

(73) Assignee: Harman International Industries, Incorporated, Stamford, CT (US)

( * ) Notice: Subject to any disclaimer, the term of this patent is extended or adjusted under 35 U.S.C. 154(b) by 171 days.

(21) Appl. No.: 16/950,475

(22) Filed: Nov. 17, 2020

(65) Prior Publication Data

US 2021/0168502 A1 Jun. 3, 2021

(30) Foreign Application Priority Data

Nov. 29, 2019 (CN) .......................... 201911201943.X (51) Int. Cl.
*H04R 3/02* (2006.01)
*H03G 11/00* (2006.01)
(Continued)

(52) U.S. Cl.
CPC ............. *H04R 3/02* (2013.01); *H03G 11/008* (2013.01); *H04B 1/1027* (2013.01); *H04R 3/14* (2013.01)

(58) Field of Classification Search
CPC . H04R 3/02; H04R 3/14; H04R 3/007; H04R 3/04; H04R 3/002; H04R 3/00; H04R 1/1083; H04R 1/1008; H04R 2201/028; H04R 2430/03; H04R 2430/01; H04R 5/04; H03G 11/008; H03G 11/00; H03G 9/025; H03G 9/02; H03G 5/165; H03G 5/16; H04B 1/1027; H04B 1/10; H04S 1/00; H04S 7/307; H04S 7/301
USPC ... 381/99, 98, 100, 101, 102, 103, 104, 105, 381/106, 107, 108, 109, 110, 61, 66, 74, 381/321, 320, 317, 55, 56, 57, 58, 118, 381/119, 120; 700/94
See application file for complete search history.

(56) References Cited

U.S. PATENT DOCUMENTS

| | | |
|---|---|---|
| 2015/0372653 A1 | 12/2015 | Onodera |
| 2017/0111020 A1* | 4/2017 | Song ...................... H04R 3/002 |
| 2018/0152167 A1 | 5/2018 | Song et al. |

OTHER PUBLICATIONS

European Search Report dated Apr. 6, 2021 for European Patent Application No. 20204841.9, 8 pages.

* cited by examiner

*Primary Examiner* — Leshui Zhang
(74) *Attorney, Agent, or Firm* — Brooks Kushman P.C.

(57) ABSTRACT

The present disclosure provides a limiter system. The limiter system includes a first equalization filter, a low-pass filter, a first limiter, a high-pass filter, a second limiter, and a mixer. The limiter system provided by the present disclosure further includes a second equalization filter. An audio signal from a signal source first passes through the first equalization filter, the signal equalized for the first time is divided into two signals, one signal is processed by the low-pass filter and the first limiter, the other signal is processed by the high-pass filter and the second limiter, and then the two processed signals enter the mixer to be mixed and outputted. The mixed output signal is subjected to second equalization filtering by the second equalization filter to avoid clipping distortion or to obtain a higher maximum sound level.

13 Claims, 5 Drawing Sheets

(51) Int. Cl.
*H04R 3/14* (2006.01)
*H03G 5/16* (2006.01)
*H04B 1/10* (2006.01)

LIMITER SYSTEM AND METHOD FOR AVOIDING CLIPPING DISTORTION OR INCREASING MAXIMUM SOUND LEVEL OF ACTIVE SPEAKER

CROSS-REFERENCE TO RELATED APPLICATIONS

This application claims priority to CN Application Serial No. 201911201943.X filed Nov. 29, 2019, the disclosure of which is hereby incorporated in its entirety by reference herein.

TECHNICAL FIELD

The present disclosure generally relates to a limiter system and a method for an active speaker. More specifically, the present disclosure relates to a limiter system and a method for avoiding clipping distortion and increasing a maximum sound level of an active speaker.

BACKGROUND

An audio signal is a carrier of regular sound wave frequency and amplitude change information. Regular audio may be represented by a sound wave or a sine wave. The sine wave includes three important parameters: frequency, amplitude, and phase, which also characterize the audio signal. Taking music as an example, people's perception of sound frequency is expressed as pitch. A higher pitch corresponds to a higher frequency. The amplitude reflects the energy magnitude of a signal. A high-amplitude waveform signal has a larger volume, and a low-amplitude waveform has a quieter sound.

In an active speaker system, when an input signal has an excessively large amplitude, and has a voltage exceeding a maximum voltage that can be output by a power amplifier after being amplified by a power amplifier, the peak and dip of the output signal waveform will be clipped, resulting in audible clipping distortion. Since the bass performance of a speaker largely depends on the size of the speaker, in order to obtain a good bass performance with a limited speaker size, a low-frequency signal needs to be amplified as much as possible, so the low-frequency signal is more likely to reach a maximum voltage limit of the amplifier. In the speaker design, a limiter is usually used to limit a maximum output voltage to a specific output level.

Therefore, a limiter, also called a clipper, is usually used in a speaker system to limit a signal so as not to exceed a maximum voltage limit of the system. A conventional limiter limits signals at all frequencies below a limiting threshold. However, since music is usually a dynamic broadband signal, the effect of this configuration is not very satisfactory. For example, when adding heavy bass, a low-frequency signal with an amplitude that reaches or exceeds the maximum voltage limit may suddenly appear in the music and impact the limiter, resulting in signals at all frequencies being equally compressed. This means that when such low-frequency signals appear, the volume of human voices at higher frequencies will suddenly drop. As this low-frequency signal disappears, the volume of human voices will suddenly increase again, which is apparently undesirable.

Another conventional limiter may impose different limiting thresholds on different bands. Taking a limiter of two bands as an example, a signal at a frequency close to a crossover frequency will be filtered out by both of a low-pass filter and a high-pass filter. When the amplitude of an input signal is large enough, the signal amplitude of a signal mixed by a mixer will exceed a limit value, resulting in audible clipping distortion. Therefore, in order to avoid this clipping noise, the limiter must be set to a lower gain to reduce a maximum sound level of the speaker system.

SUMMARY

In order to solve the above technical problems, the present disclosure provides a limiter system. The limiter system includes a first equalization filter, a low-pass filter, a first limiter, a high-pass filter, a second limiter, and a mixer. The limiter system provided by the present disclosure further includes a second equalization filter.

An audio signal from a signal source first passes through the first equalization filter, the signal filtered by the first equalization filter is divided into two signals, one signal passes through the low-pass filter and the first limiter, and the other signal passes through the high-pass filter and the second limiter. Cutoff frequencies of the low-pass filter and the high-pass filter are equal to a crossover frequency. A signal lower than the crossover frequency that is output by the low-pass filter does not exceed a first limiting threshold after passing through the first limiter, and a high-pass signal higher than the crossover frequency that is output by the high-pass filter does not exceed a second limiting threshold after passing through the second limiter. Then the two filtered and limited signals enter the mixer to be mixed.

In the limiter system provided by the present disclosure, the signal mixed by the mixer enters the second equalization filter to be performed with equalization filtering.

Preferably, the first equalization filter and the second equalization filter have the same center frequency, quality factor and gain. The first equalization filter is a peak equalization filter, and the second equalization filter is a dip equalization filter.

When a small signal is input and both the first limiter and the second limiter do not trigger limiting processing, the first equalization filter and the second equalization filter offset each other.

The present disclosure also provides a limiting method. The limiting method includes the following steps: firstly, performing equalization filtering on an audio input signal from a signal source by a first equalization filter. Herein, the equalization filtered signal is divided into two signals to make one signal pass through a low-pass filter so as to obtain a signal lower than a crossover frequency. The signal lower than the crossover frequency is input to a first limiter to be limited. The other signal passes through a high-pass filter to obtain a signal higher than the crossover frequency. The signal higher than the crossover frequency is input to a second limiter to be limited. Then, the two filtered and limited signals are respectively sent to a mixer to be mixed. The limiting method provided by the present disclosure further includes performing, by a second equalization filter, equalization filtering on a signal mixed by the mixer.

If an input signal is relatively small and neither reaches a first limiting threshold of the first limiter nor a second limiting threshold of the second limiter, the effects of the first equalization filter and the second equalization filter offset each other without affecting a sound effect of the input signal.

At least one advantage of the limiter system and the method provided by the present disclosure is that limiter system and the method can avoid clipping distortion for an active speaker and can also increase a maximum sound level of the active speaker.

BRIEF DESCRIPTION OF THE DRAWINGS

These and/or other features, aspects and advantages of the present disclosure will be better understood after reading the following detailed description with reference to the drawings. Throughout these drawings, the same numeral references represent the same components, where.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The purpose of the present disclosure is to provide a limiter system that may impose different limiting thresholds on different bands so that a maximum sound level of the system does not exceed a maximum voltage limit of a speaker system, thereby avoiding clipping distortion or increasing the maximum sound level of an active speaker system. A limiter with two bands will be taken as an example below to illustrate the limiter system of the present disclosure in which an audio signal from a signal source is divided into a low-frequency band and a high-frequency band for processing respectively.

Figure 1:
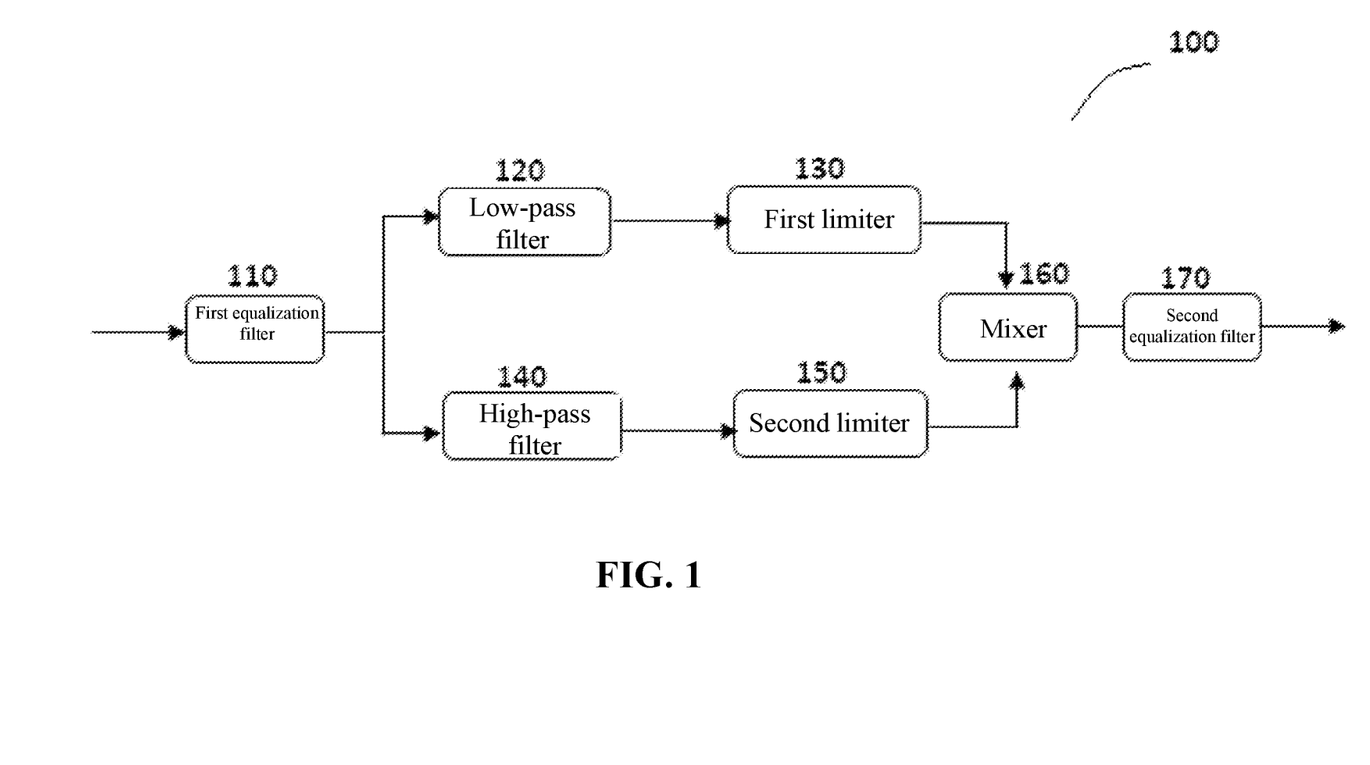
FIG. 1 shows a structure of a limiter system according to an embodiment of the present disclosure.

As shown in FIG. 1, limiter system 100 provided in the present disclosure is shown in FIG. 1, which includes first equalization filter 110, low-pass filter 120, first limiter 130, high-pass filter 140, second limiter 150, and mixer 160. In addition, the limiter system provided by the present disclosure further includes second equalization filter 170.

It can be seen from FIG. 1 that in limiter system 100 shown in FIG. 1, an audio signal (for example, music) from a signal source (not shown) first enters first equalization filter 110 for equalization filter tuning. For the use of an equalization filter, tuned parameters mainly include a center frequency fc, a quality factor Q, and a gain G. In limiter system 100 of the present disclosure, first equalization filter 110 increases a speak shape of a signal with a center frequency $fc_{EQ1}$, that is, at this moment, a gain $G_{\_EQ1}$ is positive, while signals with other frequencies are not processed. This adjustment enables the signal to gain at the center frequency $fc_{\_EQ1}$ of first equalization filter 110 so that a very high level can be obtained, while other frequency levels remain unchanged, resulting in the sound loudness at the center frequency $fc_{\_EQ1}$ being greater than the sound at other frequencies. The concerned selection of the center frequency $fc_{\_EQ1}$ of first equalization filter 110 is related to a crossover frequency that divides an audio signal into high and low bands.

In order to enable the speaker to impose limiting thresholds on different bands, the audio signal needs to be divided into different bands accordingly. In the present disclosure, an input audio signal is divided into two bands, for example, a low-frequency band and a high-frequency band.

For a speaker, a signal generated by a signal source is an audio signal with, for example, an audio frequency. As known to those skilled in the art, the range of the full audio frequency is roughly between 20 Hz and 20 kHz. The limiter system provided by the present disclosure may be applied to an audio signal with an input signal within the full audio frequency range. For such an audio input signal, a low-pass filter and a high-pass filter may be used for crossover to form two parts: a signal lower than a crossover frequency and a signal higher than the crossover frequency.

A case is taken as an example. In order to remain a human voice part, for example, contained in an audio signal unchanged, considering that the frequency range of the human voice is approximately from 300 Hz to 3400 kHz, the audio signal may determine a part higher than, for example, 300 Hz as a high-frequency band and a part lower than, for example, 300 Hz as a low-frequency band. Therefore, referring to limiter system 100 shown in FIG. 1, a cutoff frequency $f_{\_cutoff\_Lp}$ of low-pass filter 120 may be set to, for example, 300 Hz, and a cutoff frequency $f_{\_cutoff\_Hp}$ of high-pass filter 140 may also be set to, for example, 300 Hz. In this case, low-pass filter 120 and high-pass filter 140 are based on the same cutoff frequency. The cutoff frequency is called a crossover frequency $f_{\_crossover}$. For example, the crossover frequency in limiter system 100 shown in FIG. 1 is set to, for example, $f_{\_crossover}$=300 Hz.

Next, referring to FIG. 1 again, after low-pass filter 120 filters out the signal higher than the crossover frequency, the remaining signals lower than the crossover frequency enter first limiter 130. First limiter 130 has a first limiting threshold $Th_{\_limiter\_1}$, that is, a maximum amplitude value. If the signal lower than the crossover frequency exceeds the first limiting threshold $Th_{\_limiter\_1}$ at this moment, the signal lower than the crossover frequency is wholly compressed not to exceed the first limiting threshold. It can be seen that when the input signal lower than the crossover frequency is large enough, the signal lower than the crossover frequency in the first limiter may be compressed wholly, and when the input signal lower than the crossover frequency is small, the first limiter may not operate.

Correspondingly, in the high-frequency band part, as shown in FIG. 1, after high-pass filter 140 filters out the signal lower than the crossover frequency, the retained high-frequency signal enters second limiter 150. Second limiter 150 has a second limiting threshold (clipping value) $Th_{\_limiter\_2}$. If the signal higher than the crossover frequency exceeds the second limiting threshold $Th_{\_limiter\_2}$ at this moment, the signal higher than the crossover frequency is wholly compressed not to exceed the second limiting threshold. In other words, when the input signal higher than the crossover frequency is large enough, the signal higher than the crossover frequency in the second limiter may be compressed wholly, and when the input signal higher than the crossover frequency is small, the second limiter may not operate.

The signals after being limited by the first limiter and the second limiter respectively enter the mixer 160. The mixer 160 outputs audio signals that have undergone separate limiting processing on different bands, so the maximum limiting threshold is not set equally for all frequencies. For dynamic broadband signals such as music, for example, in the case of enhanced bass, low-frequency signals with amplitude exceeding the maximum voltage limit may suddenly appear in the music, which will cause the signals at all frequencies to be equally compressed.

Limiter system 100 provided by the present disclosure further includes second equalization filter 170. Second equalization filter 170 is connected downstream of the mixer 160 and is a dip equalization filter. In second equalization filter 170, an audio signal at a center frequency $f_{C\_EQ2}$ of second equalization filter 170 is attenuated and the waveform drops, that is, a gain $G_{EQ2}$ of second equalization filter 170 is set to be negative herein. Therefore, it may also be regarded as a decreased gain, and other frequency signals are not processed.

Figure 2:
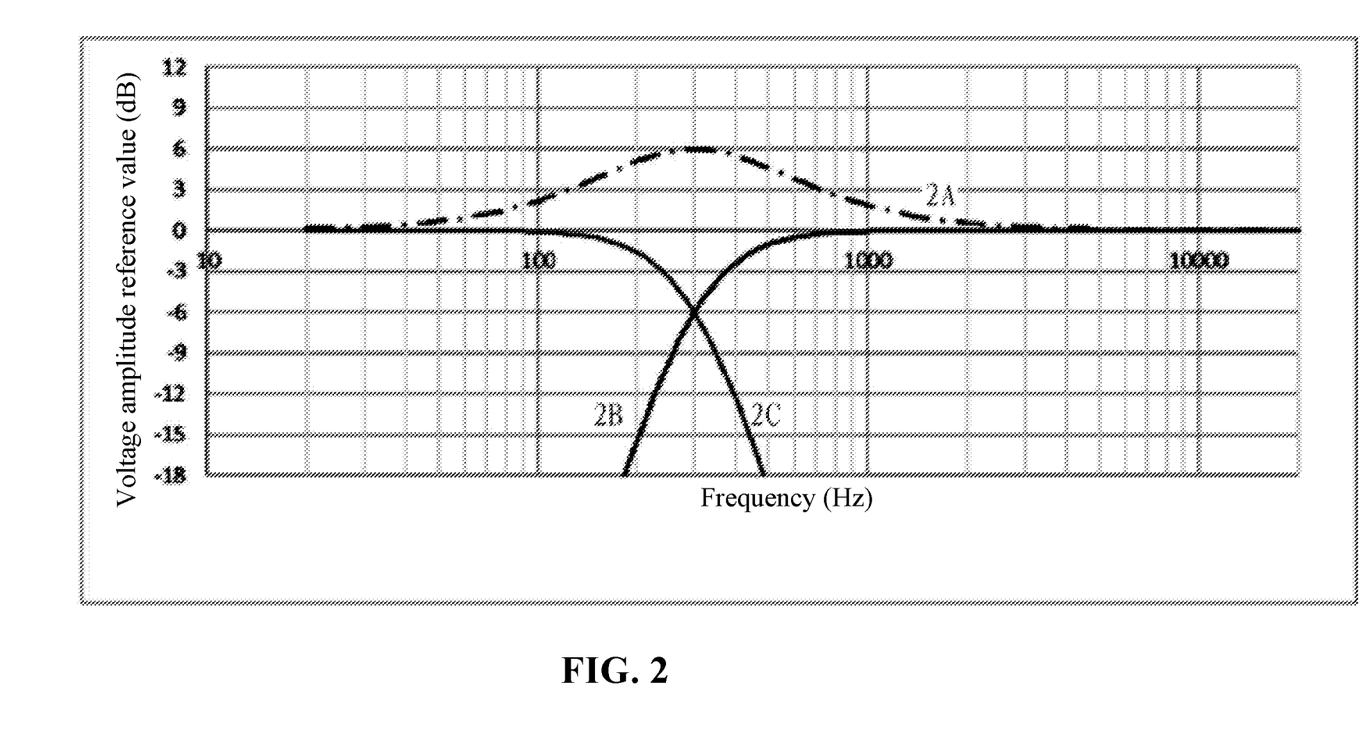
FIG. 2 shows electrical frequency response curves of output signals of a first limiter, a second limiter and a mixer in the limiter system of FIG. 1.

The role of second equalization filter 170 in limiter system 100 of the present disclosure may be described in conjunction with FIG. 2.

Referring to FIG. 2, an electrical frequency response curve of an output signal processed by first limiter 130 is shown as 2B in FIG. 2. As shown in FIG. 2, for example, when a limiting threshold $Th_{limiter\_1}$ of first limiter 130 is set to 0 dB, it can be seen that after being processed by low-pass filter 120 and first limiter 130, a signal lower than a cutoff frequency $f_{cutoff\_Lp}$ of low-pass filter 120, that is, a crossover frequency $f_{crossover}$ passes through, and a frequency signal higher than the crossover frequency $f_{crossover}$ is suppressed. The electrical frequency response curve 2B of a signal output by first limiter 130 after limiting is not greater than 0 dB.

Also referring to FIG. 2, an electrical frequency response curve of an output signal processed by second limiter 150 is shown as 2C in FIG. 2. For example, when a limiting threshold $Th_{limiter\_2}$ of second limiter 150 is also set to 0 dB, it can be seen that after being processed by high-pass filter 140 and second limiter 150, a signal higher than a cutoff frequency $f_{cutoff\_Hp}$ of high-pass filter 140, that is, a crossover frequency $f_{crossover}$ passes through, and a frequency signal higher than the crossover frequency $f_{crossover}$ is suppressed. The electrical frequency response curve 2C of a signal output by second limiter 150 after limiting is not greater than 0 dB.

FIG. 2 also shows an electrical frequency response curve 2A of an audio signal processed and output by low-pass filter 120 and first limiter 130 and another audio signal processed and output by high-pass filter 140 and second limiter 150 after being mixed in mixer 160. It can be seen from FIG. 2 that in the above example, the electrical frequency response curve of the output signal after mixing in mixer 160 has a higher peak shape within a frequency range of 100 Hz to 1 kHz, which exceeds the threshold 0 dB of first limiter 130 and second limiter 150 in limiter system 100.

The reason why the mixed signal exceeds the limiting threshold is that after an audio signal tuned by first equalization filter 110 at the crossover frequency f crossover is filtered out by both of low-pass filter 120 and high-pass filter 140. However, actual filtering of a signal by a low-pass filter and a high-pass filter cannot make the signal stop suddenly at the cutoff frequency of the respective filter, but attenuate to a certain extent at the cutoff frequency. For example, in limiter system 100 of the present disclosure, after passing through low-pass filter 120 and first limiter 130 and passing through high-pass filter 140 and second limiter 150, the electrical frequency response curves 2B and 2C of two output signals intersect with a certain slope at the crossover frequency. In this example, the two signals are attenuated to −6 dB at this moment, as shown in FIG. 2. Therefore, the amplitude of the superimposed signal after mixing the two signals in mixer 160 is exactly 0 dB. Therefore, when the input signal continues to increase and exceeds −6 dB, the amplitude of the superimposed signal after mixing the two signals in mixer 160 is higher, which is higher than the limiting threshold 0 dB of the limiter.

As noted above, the limiter system 100 of the present disclosure further includes second equalization filter 170. A center frequency $f_{EQ2}$ of second equalization filter 170 is set to be the same as the center frequency $f_{EQ1}$ of first equalization filter 110 and to be equal to or close to the crossover frequency $f_{crossover}$, while second equalization filter 170 is set to have the same quality factor as and different gains from first equalization filter 110 ideally. That is, the increase degree of the audio signal at the center frequency $f_{EQ1}$ in first equalization filter 110 corresponds to the decrease degree of the audio signal at the center frequency $f_{EQ2}$ in second equalization filter 170.

Figure 3:
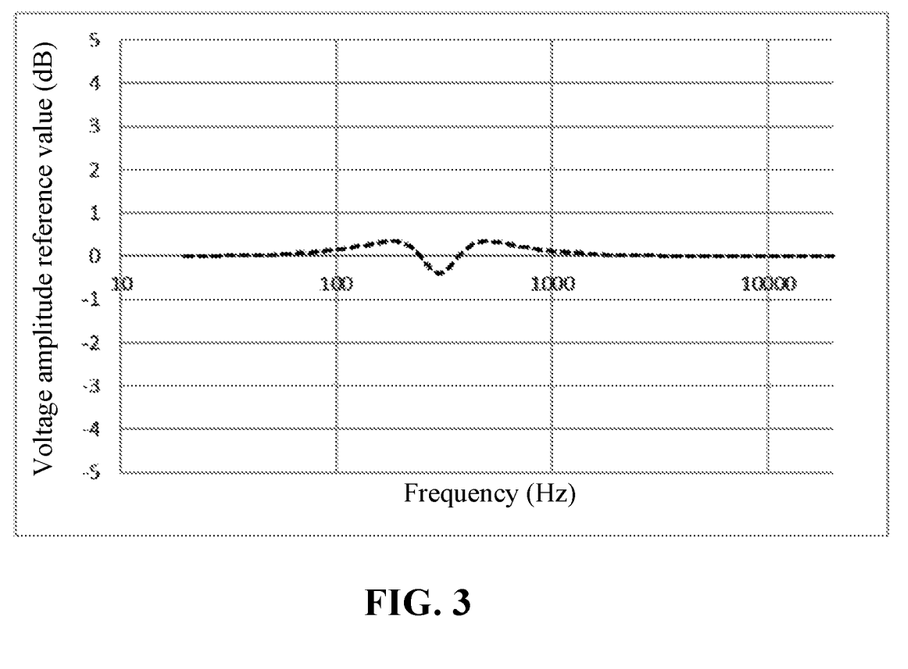
FIG. 3 shows an electrical frequency response curve of an output signal of the limiter system of FIG. 1 after being added with a second equalization filter.

FIG. 3 shows an electrical frequency response curve of an output signal processed by second equalization filter 170. When both an input signal lower than the crossover frequency $f_{crossover}$ and a signal higher than the crossover frequency $f_{crossover}$ are relatively small, first limiter 130 and second limiter 150 will not be triggered to perform limiting processing, that is, the sound quality is not affected when the input signal is not high enough to trigger the limiter. In this case, the equalization filtering in second equalization filter 170 completely offsets the tuning of first equalization filter 110, and the electrical frequency response curve of the audio signal output by second equalization filter 170 should be a straight horizontal line. However, those skilled in the art can imagine that when the input audio signal gradually increases and the amplitude of the signal is large enough, the limiter will be triggered, and if the first limiter and the second limiter are not triggered simultaneously, the signal passing through the mixer does not form a standard "peak" shape near the crossover frequency, so that unevenness as shown in FIG. 3 may appear after being attenuated by second equalization filter 170.

Figure 4:
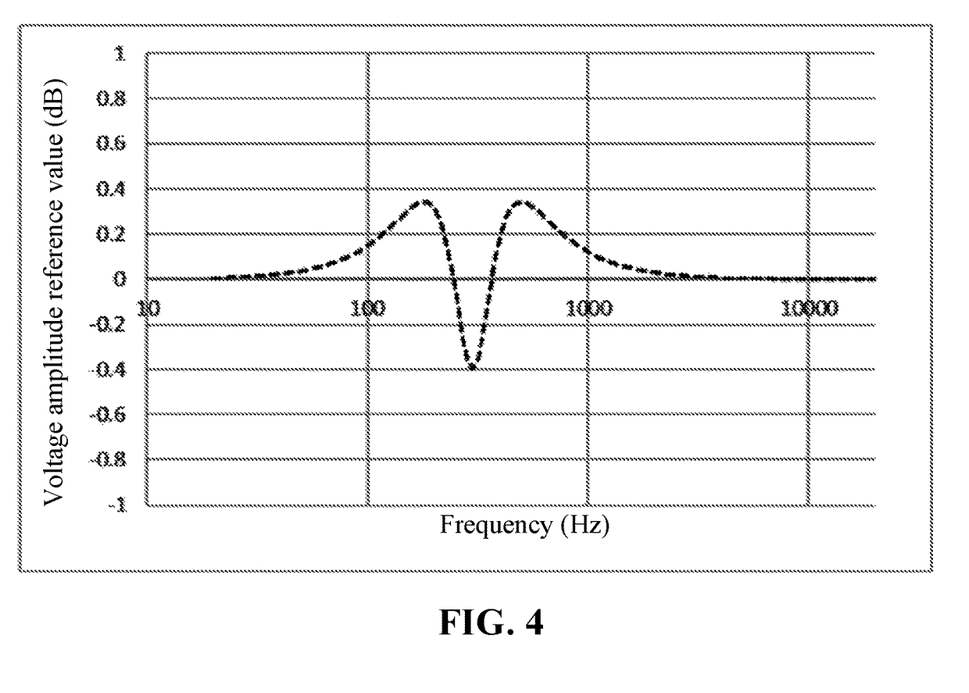
FIG. 4 shows a partial enlarged view of FIG. 3.

In FIG. 4, by zooming in and observing the ordinate in FIG. 3, it can be seen that the electrical frequency response curve of the output signal has a "peak-dip-peak" shape when second equalization filter 170 is employed. When the limiting thresholds of the first limiter and the second limiter are set to be different, that is, $Th_{limiter\_1} \pm Th_{limiter\_2}$, the situation may be more complicated.

Figure 5:
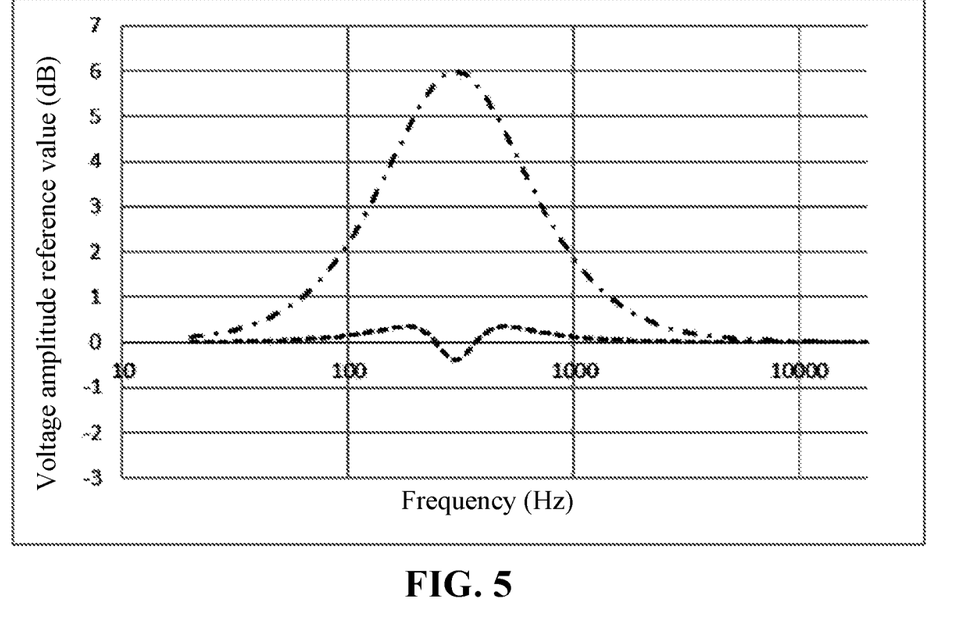
FIG. 5 shows a comparison diagram of electrical frequency response curves of output signals of the limiter system shown in FIG. 1 before and after being added with the second equalization filter.

FIG. 5 shows a comparison diagram of electrical frequency response curves of an input signal and an output signal of second equalization filter 170 in limiter system 100 of the present disclosure. As shown in FIG. 5, the dotted line in the figure represents an electrical frequency response curve of a signal with a maximum input before being input to second equalization filter 170. If a maximum output limiting threshold after system amplification is 0 dB, it can be predicted that the electrical frequency response curve of the output signal will have apparent clipping within the frequency range of 50 Hz to 2 kHz, resulting in greater distortion.

The dotted line in FIG. 5 represents an electrical frequency response curve of an output signal with a maximum input after being performed with equalization filtering by second equalization filter 170. In contrast, after passing through second equalization filter 170, the electrical frequency response curve of the signal forms a peak-dip-peak shape between 100 Hz and 1 kHz, so even if the limiting threshold is set to 0 dB, the clipping distortion is greatly reduced.

It can thus be seen that in the present disclosure, if the input signal voltage is high, second equalization filter 170 can reduce the voltage of the output signal after being mixed by mixer 160 which is close to the crossover frequency $f_{\_crossover}$. Therefore, it is possible to avoid clipping distortion in a wide range, or to increase the maximum sound pressure level in the speaker system. If the output signal does not reach the limiting value of the limiter system, first equalization filter 110 and second equalization filter 170 can offset each other, so that there is no influence on the tone of music from the signal source. In general, the system of the present disclosure may avoid some shortcomings of conventional limiters, such as unstable human voice and clipping distortion. On the other hand, the limiter system 100 and the method of the present disclosure can increase the voltage utilization rate to ensure that the maximum sound level is obtained without distortion.

Therefore, in summary, the various parameters involved in the limiter system 100 provided in the present disclosure may be summarized as having the following relationship: in the limiter system provided in the present disclosure, the low-pass filter 120 and the high-pass filter 140 are based on the same cutoff frequency $f_{\_cutoff\_Lp}=f_{\_cutoff\_Hp}$. The cutoff frequency is called a crossover frequency $f_{\_crossover}$. The first limiter 130 is configured to limit the amplitude of a signal at a frequency lower than the crossover frequency $f_{\_crossover}$, and the second limiter 150 is configured to limit the amplitude of a signal at a frequency higher than the crossover frequency $f_{\_crossover}$.

The first equalization filter 110 is a peak equalization filter, and the second equalization filter 170 is a dip equalization filter. The center frequencies of the first equalization filter 110 and the second equalization filter 170 are equal $f_{C\_EQ1}=f_{C\_EQ2}$, and are respectively equal or similar to the crossover frequency $f_{\_crossover}$. Moreover, the first equalization filter 110 and the second equalization filter 170 have the same quality factor $Q_{\_EQ1}=Q_{\_EQ2}$, and absolute values of an increased gain $G_{\_EQ1}$ of the first equalization filter 110 and a decreased gain $G_{\_EQ2}$ of the second equalization filter 170 are equal, that is:

$f_{Lp\_cutoff}=f_{Hp\_cutoff}=f_{\_crossover}$;
$f_{\_EQ1}=f_{\_EQ2}$;
$Q_{\_EQ1}=Q_{\_EQ2}$;
$|G_{\_EQ1}|=|G_{\_EQ2}|$ where $f_{\_cutoff\_Lp}$ is the cutoff frequency of the low-pass filter 120, and $f_{\_cutoff\_Hp}$ is the cutoff frequency of the high-pass filter 140;

$f_{\_crossover}$ is the crossover frequency;

$f_{\_EQ1}$ is the center frequency of the first equalization filter 110, and $f_{\_EQ2}$ is the center frequency of the second equalization filter 170;

$Q_{\_EQ1}$ is the quality factor of the first equalization filter 110, and $Q_{\_EQ2}$ is the quality factor of the second equalization filter 170; and $G_{\_EQ1}$ is the gain of the first equalization filter 110, and $G_{\_EQ2}$ is the gain of the second equalization filter 170.

However, those skilled in the art can understand that the setting relationship of the above parameters is implemented in an ideal state. In fact, in the use of a speaker, a user often selects an audio signal from a signal source as a favorite sound effect, such as pop, rock, dance, classical, jazz, metal or heavy bass, which is actually tuned through different settings of an equalization filter in order to achieve a more ideal effect. On the other hand, the user can also manually tune the gain and quality factor of each frequency of the equalization filter, and by using the equalizer to process input signals of different frequencies, the speaker may be compensated and modified. In this case, it is likely that when audio signals of other frequencies need to be tuned, various changes in the quality factor and gain, as well as the tuning of adjacent frequencies, will affect the crossover frequency in the present disclosure, which may be another reason for the unevenness of the electrical frequency response curve of the signal equalized by the added second equalization filter 170 in the foregoing description of the present disclosure. Therefore, those skilled in the art can imagine that when the first equalization filter 110 and the second equalization filter 170 are used in practice, the center frequency, quality factor and gain of the two filters are not necessarily set to be equal. Rather, in order to obtain perfect sound effects, the various tuning of the equalization filters should be set according to actual needs.

In summary, the limiter system 100 and the method provided by the present disclosure can reduce the voltage close to the crossover frequency after passing through the mixer 160 by adding the second equalization filter 170 when the input signal voltage is high in voltage, thereby avoiding clipping distortion to a large extent, or increasing the maximum sound pressure level of the speaker system. Moreover, if the input signal does not reach the limiting threshold of the limiter, the tuning of the first equalization filter 110 and the second equalization filter 170 may offset each other without any influence on the tone. In general, the limiter system 100 and the method of the present disclosure overcome the shortcomings of traditional limiters, such as unstable human voice and audible clipping distortion. In addition, by using the limiter system 100 and the method provided by the present disclosure, the voltage utilization rate can be increased to ensure that the speaker plays at a maximum sound level without distortion.

For illustrative purposes, the present disclosure has provided a description of the embodiments, but the described embodiments are not exhaustive or limited to the embodiments disclosed herein. Without departing from the scope and spirit of the described embodiments, those of ordinary skill in the art will appreciate that there are many modifications and changes.

Various aspects of the current embodiments may be embodied as a system, a method, or a computer program product. Therefore, various aspects of the present disclosure may take the following forms: a complete hardware embodiment, a complete software embodiment (including firmware, resident software, microcode, etc.), or a combination of software and hardware embodiments, which may be all regarded as "module" or "system" generally herein. In addition, any hardware and/or software technology, process, function, component, engine, module, or system described in the present disclosure may be implemented as a circuit or a group of circuits. In addition, various aspects of the present disclosure may take the form of a computer program product embodied in one or more computer-readable media on which computer-readable program code is embodied.

Any combination of one or more computer-readable media may be utilized. The computer-readable medium may be a computer-readable signal medium or a computer-readable storage medium. The computer-readable storage medium may be, for example, but not limited to, an electronic, magnetic, optical, electromagnetic, infrared, or semiconductor system, device or apparatus, or any suitable combination of the foregoing. More specific examples (non-exhaustive list) of computer-readable storage media may include each of the following: an electrical connection with one or more wires, a portable computer floppy disk, a hard disk, a random access memory (RAM), a read only memory (ROM), an erasable programmable read-only memory (EPROM or flash memory), an optical fiber, a portable CD-ROM, an optical storage apparatus, a magnetic storage apparatus, or any suitable combination of the foregoing. In the context of this document, a computer-readable storage medium may be any tangible medium that can contain or store a program for use by an instruction execution system, device, or apparatus or in combination with the instruction execution system, device, or apparatus.

The aspects of the present disclosure are described above with reference to flowchart illustrations and/or block diagrams of methods, devices (systems) and computer program products according to the implementations of the present disclosure. It will be understood that each block of the flowchart illustrations and/or block diagrams and combinations of blocks in the flowchart illustrations and/or block diagrams may be implemented by computer program instructions. These computer program instructions may be provided to processors of general purpose computers, special purpose computers, or other programmable data processing devices to produce machines. When the instructions are executed via the processors of the computers or other programmable data processing devices, the functions/actions specified in the flowchart and/or block diagram block or multiple blocks can be realized. These processors m be, but are not limited to, general purpose processors, special purpose processors, special application processors, or field programmable gate arrays.

The flowcharts and block diagrams in the drawings illustrate the architecture, functionality, and operation of possible implementations of systems, methods, and computer program products according to various embodiments of the present disclosure. In this regard, each block in the flowchart or block diagram may represent a module, section, or part of code, and the code includes one or more executable instructions for implementing prescribed logical functions. It should also be noted that in some alternative implementations, the functionality described in the blocks may occur out of the order described in the drawings. For example, two blocks shown in succession may actually be executed substantially simultaneously, or the blocks may sometimes be executed in the reverse order depending on the functionality involved. It should also be noted that each block in the block diagram and/or flowchart illustration and the combination of the blocks in the block diagram and/or flowchart illustration can be implemented by a dedicated hardware-based system or dedicated hardware and computer instructions that perform the specified functions or actions.

Although the foregoing content is directed to the embodiments of the present disclosure, other and additional embodiments of the present disclosure may be conceived without departing from the basic scope of the present disclosure, and the scope of the present disclosure is determined by the appended claims.

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A limiter system for an active speaker, comprising:
   a first equalization filter;
   a low-pass filter, connected to the first equalization filter and outputting a signal lower than a crossover frequency;
   a high-pass filter, connected to the first equalization filter and outputting a signal higher than the crossover frequency;
   a first limiter, configured to receive and limit the signal lower than the crossover frequency;
   a second limiter, configured to receive and limit the signal higher than the crossover frequency; and
   a mixer, configured to mix the signal lower than the crossover frequency that is limited by the first limiter with the signal higher than the crossover frequency that is limited by the second limiter,
   wherein the limiter system further comprises a second equalization filter configured to receive and perform equalization filtering on a signal output from the mixer,
   wherein the first limiter is configured to cause the signal lower than the crossover frequency not to exceed a first limiting threshold, and the second limiter is configured to cause the signal higher than the crossover frequency not to exceed a second limiting threshold, and
   wherein the first limiting threshold and the second limiting threshold are the same.

2. The limiter system of claim 1, wherein a center frequency of the first equalization filter is the same as a center frequency of the second equalization filter.

3. The limiter system of claim 1, wherein the first equalization filter increases a first signal at a center frequency of the first equalization filter, and the second equalization filter decreases a second signal at a center frequency of the second equalization filter.

4. The limiter system of claim 3, wherein an absolute value of an increased gain of the first equalization filter is equal to an absolute value of a decreased gain of the second equalization filter.

5. The limiter system of claim 1, wherein the first equalization filter and the second equalization filter have a same quality factor.

6. The limiter system of claim 1, wherein the first equalization filter is a peak equalization filter and the second equalization filter is a dip equalization filter.

7. A limiting method for an active speaker comprising:
   performing equalization filtering on an input signal by a first equalization filter;
   performing low-pass filtering, on an output of the first equalization filter, by a low-pass filter to output a signal lower than a crossover frequency;
   outputting a signal higher than the crossover frequency by a high-pass filter applied to an output of a first equalization filter;
   limiting the signal lower than the crossover frequency by a first limiter;
   limiting the signal higher than the crossover frequency by a second limiter; and
   mixing the limited signal lower than the crossover frequency with the limited signal higher than the crossover frequency by a mixer,
   performing, by a second equalization filter, equalization filtering on a signal mixed by the mixer, wherein the limiting method further comprises: making, by the first limiter, the signal lower than the crossover frequency not to exceed a first limiting threshold, and making, by the second limiter, the signal higher than the crossover frequency not to exceed a second limiting threshold, and setting the first limiting threshold and the second limiting threshold to be the same.

8. The limiting method of claim 7 further comprising setting a center frequency of the second equalization filter to be the same as a center frequency of the first equalization filter.

9. The limiting method of claim 7 further comprising increasing a signal at a center frequency of the first equalization filter by the first equalization filter and decreasing a signal at a center frequency of the second equalization filter by the second equalization filter.

10. The limiting method of claim 9 further comprising setting an increased gain of the first equalization filter and a decreased gain of the second equalization filter to have an equal absolute value.

11. The limiting method of claim 7 further comprising setting the second equalization filter and the first equalization filter to have the same quality factor.

12. The limiting method of claim 7, wherein the first equalization filter is a peak equalization filter, and the second equalization filter is a dip equalization filter.

13. A computer-program product embodied in a non-transitory computer readable medium that is programmed for limiting method for an active speaker, the computer-program product comprising instructions and being executable by at least one processor to perform:
  performing equalization filtering on an input signal by a first equalization filter;
  performing low-pass filtering on an output of the first equalization filter by a low-pass filter to output a signal lower than a crossover frequency;
  outputting a signal higher than the crossover frequency by a high-pass filter applied to the output of the first equalization filter;
  limiting the signal lower than the crossover frequency by a first limiter;
  limiting the signal higher than the crossover frequency by a second limiter; and
  mixing the limited signal lower than the crossover frequency with the limited signal higher than the crossover frequency by a mixer,
  performing, by a second equalization filter, equalization filtering on a signal mixed by the mixer,
  causing the signal lower than the crossover frequency not to exceed a first limiting threshold,
  causing the signal higher than the crossover frequency not to exceed a second limiting threshold, and
  setting the first limiting threshold and the second limiting threshold to be the same.

\* \* \* \* \*